(12) United States Patent
Matsumura et al.

(10) Patent No.: US 8,482,003 B2
(45) Date of Patent: Jul. 9, 2013

(54) IMAGE DISPLAY UNIT

(75) Inventors: Mieko Matsumura, Kokubunji (JP); Yoshiaki Toyota, Hachioji (JP); Takeshi Sato, Kokubunji (JP); Mutsuko Hatano, Kokubunji (JP)

(73) Assignees: Hitachi Displays, Ltd., Chiba-Ken (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 336 days.

(21) Appl. No.: 11/874,955

(22) Filed: Oct. 19, 2007

(65) Prior Publication Data

US 2008/0093602 A1    Apr. 24, 2008

(30) Foreign Application Priority Data

Oct. 20, 2006   (JP) ................. 2006-286235

(51) Int. Cl.
*H01L 31/00*   (2006.01)

(52) U.S. Cl.
USPC .................. 257/59; 257/72; 257/E27.112

(58) Field of Classification Search
CPC ................................................ H01L 27/1214
USPC ............. 257/5, 59, 72, 88, 258, 347, 658, 257/909, 910, 911, E27.112, E27.117, E29.287, 257/E29.29, 75; 438/34, 73, 109
See application file for complete search history.

(56) References Cited

U.S. PATENT DOCUMENTS

| | | | |
|---|---|---|---|
| 6,462,802 B1 * | 10/2002 | Nishimura et al. | 349/147 |
| 6,900,464 B2 * | 5/2005 | Doi et al. | 257/72 |
| 7,435,631 B2 * | 10/2008 | Yang | 438/149 |
| 2005/0072754 A1 | 4/2005 | Shih et al. | |
| 2005/0211983 A1 * | 9/2005 | Kaitoh et al. | 257/66 |
| 2005/0224793 A1 * | 10/2005 | Chang et al. | 257/59 |
| 2005/0263768 A1 * | 12/2005 | Ahn | 257/72 |
| 2006/0006391 A1 * | 1/2006 | Matsumura et al. | 257/72 |
| 2006/0145162 A1 * | 7/2006 | Yang | 257/72 |
| 2006/0197086 A1 * | 9/2006 | Rhee et al. | 257/59 |
| 2007/0152217 A1 * | 7/2007 | Lai et al. | 257/59 |
| 2007/0252145 A1 * | 11/2007 | Toyota et al. | 257/59 |
| 2009/0073335 A1 * | 3/2009 | Yagi et al. | 349/39 |

FOREIGN PATENT DOCUMENTS

| | | |
|---|---|---|
| JP | 06-095157 | 4/1994 |
| JP | 11-087714 | 3/1999 |
| JP | 2000-228527 | 8/2000 |

OTHER PUBLICATIONS

N. Ibaraki, "Low Temperature Poly-Si TFT Technology", The Society for Information Display International Symposium; Digest of Technical Papers, p. 172; 1999.

* cited by examiner

*Primary Examiner* — Cuong Q Nguyen
*Assistant Examiner* — Yosef Gebreyesus
(74) *Attorney, Agent, or Firm* — Antonelli, Terry, Stout & Kraus, LLP.

(57) ABSTRACT

An image display unit is provided for which it is possible to reduce the number of ion plantation and photolithographic processes required to manufacture the device. A gate electrode GT is a laminated structure of a thin bottom layer metal film GMB and a top layer metal film GMT. A top electrode of a storage capacitor Cst is formed of the bottom layer metal film GMB and ion implantation for the top electrode is performed at the same time as the ion implantation of source-drain electrodes. The gate electrode of a PMOSTFT of the device is also formed with the bottom layer metal GMB, and the ion implantation for threshold adjustment is performed by using the same resist.

8 Claims, 13 Drawing Sheets

IMAGE DISPLAY UNIT

BACKGROUND OF THE INVENTION

1. Field of the Invention

The present invention relates to an active matrix type image display unit using a thin-film transistor and to a method for manufacturing the same. In particular, the invention relates to an image display unit using a thin-film transistor by reducing the number of processes for ion implantation and photolithography in the preparation of the thin-film transistor. The invention also relates to a method for manufacturing the same.

2. Description of the Prior Art

In an active matrix type image display unit, an active element represented by a thin-film transistor is prepared on an insulating substrate made of glass or the like in a pixel circuit and in peripheral circuits for driving the pixel circuit. As the active matrix type image display unit, a liquid crystal display unit or an organic EL display unit is widely used in practical application or is now on the stage toward practical application. Here, the description is given on the liquid crystal display unit and the organic EL display unit as examples, while it is needless to say that this can be applied to the other active matrix type image display unit, which is based on different concept of display.

A thin-film transistor (also referred as "TFT") using polysilicon exhibits the mobility by two digits or more higher than the TFT using amorphous silicon. As an example to provide such characteristics, an active matrix type liquid crystal display unit described in the Non-patent Document 1 may be cited. This image display unit is a flat type image display unit called "flat panel display" (FPD). By designing a part of peripheral circuits (such as driving circuits) of this display unit as polysilicon TFT, the number of connecting terminals between pixel area and the peripheral circuits can be reduced, and a high-precision image display can be accomplished.

FIG. 29 is a circuit diagram of a liquid crystal display unit, which is an example of the image display unit according to the prior art. FIG. 30 (a) is a plan view of the thin-film transistor to constitute peripheral circuits (a data line driving circuit DDR and a gate line driving circuit GDR) in FIG. 29, and FIG. 30 (b) is a plan view of a pixel area PXL. FIG. 31 represents cross-sectional drawings along the lines A-A', B-B', and C-C' in FIG. 30 respectively. FIG. 32 to FIG. 39 each represents a process drawing of a PMOSTFT region, a NMOSTFT region and a storage capacitor Cst shown in FIG. 31 respectively. In FIG. 32 to FIG. 39, the NMOSTFT region is shown at the left in each of the drawings, and the PMOSTFT region is shown at the center of each of the drawings. The NMOSTFT and the storage capacitor Cst are shown at the left in each of the drawings. The details as described above are given only in FIG. 32.

As the thin-film transistor, a top gate type low temperature polysilicon TFT is used. The gate electrode is made of a type of non-transparent metal film. The PMOSTFT, the NMOSTFT and the top electrode of the storage capacitor Cst have the same thickness.

The pixel area PXL comprises a TFT (NMOSTFT), a storage capacitor Cst, and a liquid crystal LC, and it is driven by a signal sent via a data line DL, a gate line GL and a capacity line CL from a data line driving circuit DDR and a gate line driving circuit GDR. A high density n-type polysilicon layer and a gate line electrode layer are used in the bottom electrode and the top electrode of the storage capacitor. The peripheral circuit comprises NMOSTFT and PMOSTFT.

The method for manufacturing this liquid crystal display unit is as follows: On an insulating substrate SUB preferably made of glass plate, a laminated film BUF of silicon nitride and silicon oxide is deposited in thickness of 100 nm as a buffer layer (an underlying film). Further, an amorphous silicon layer is deposited in thickness of 50 nm by the plasma CVD method. Next, XeCl excimer laser is projected to crystallize the amorphous silicon layer. Then, dry etching is performed by using resist (prepared by patterning in photolithographic process already known) as a mask, and a polysilicon layer PSI in island-like shape is obtained. Next, a gate insulator film GI is deposited in thickness of 100 nm by the plasma CVD method (deposition of the gate insulator film) (FIG. 32).

Ion implantation for threshold adjustment of NMOSTFT is performed over the entire surface, and low density p-type region LDP is prepared. The second photolithographic process is performed, and ion implantation for threshold adjustment of PMOSTFT (low density n-type implantation LDN) is carried out only on the region where PMOSTFT is to be prepared (FIG. 33).

The third photolithographic process is performed, and ion implantation is carried out on the bottom electrode of the storage capacitor Cst. This ion implantation is high density n-type ion implantation (HDN) (FIG. 34).

A gate metal film is deposited, and the fourth photolithographic process is performed. By wet etching, a gate electrode GT is prepared. In this case, over-etching is performed so that contour of the metal film of the gate electrode is moved back toward inner side by about 1 μm compared with contour of the resist RST (FIG. 35).

By using the resist RST shown in FIG. 35 as a mask, high density n-type source-drain ion implantation (HDN) is carried out. Next, the resist RST is removed, and low density n-type LDD (Lightly Doped Drain) ion implantation (LDN) is performed. In general, NMOSTFT has high leakage current, and the leakage current is suppressed through alleviation of electric field by providing LDD region. Hot carrier resistance can be improved by the alleviation of electric field (FIG. 36).

The fifth photolithographic process is performed, and high density p-type ion implantation (HDP) is carried out only on PMOSTFT (FIG. 37).

An interlayer insulator film INS1 is deposited. The sixth photolithographic process is performed, and a contact hole is formed by dry or wet etching. Metal for wiring is deposited. The seventh photolithographic process is performed, and the source-drain electrodes SD are prepared by dry or wet etching (FIG. 38).

An interlayer insulator film INS2 and a protective insulator film PAS are deposited. The eighth photolithographic process is performed, and a contact hole is formed. A transparent conductive film for pixel electrode is deposited. The ninth photolithographic process is preformed, and a pixel electrode PX is prepared (FIG. 39).

The prior art of this type is disclosed in the Non-Patent Document 1.

[Non-Patent Document 1] The Society for Information Display International Symposium; Digest of Technical Papers, p. 172; 1999.

SUMMARY OF THE INVENTION

In the thin-film transistor according to the prior art, the gate electrode is made of one type of a non-transparent metal film, and it is in the same thickness as the gate electrodes of PMOSTFT and NMOSTFT and the top electrode of the storage capacitor Cst. The doping of impurities on the bottom electrode of the storage capacitor Cst is performed separately from the process of doping for the source-drain. Also, the photolithographic process for threshold adjustment of PMOSTFT is performed separately from the photolithographic process for ion implantation of the source-drain of PMOSTFT. The photolithographic process includes the processes of resist coating, exposure to light, developing, baking, and removal of resist. It is a process requiring the longest time among a series of processes, and long time is needed for the manufacturing procedure.

It is an object of the present invention to provide an image display unit, which can be produced in shorter time by manufacturing a thin-film transistor of such a structure that the number of processes can be reduced in the ion implantation process and in the photolithographic process.

The present invention provides an image display unit, which comprises an active matrix substrate, which includes a plurality of gate lines deposited on an insulating substrate and a plurality of data lines prepared in matrix form on said plurality of gate lines, a plurality of pixels are deposited at intersections of said gate lines and said data lines and peripheral circuits including a driving circuit to drive said pixels are provided on outer side of a display region, which contains said plurality of pixels, there are provided a thin-film transistor and a storage capacitor on each of said pixels, and said active matrix substrate comprises a thin-film transistor on said peripheral circuit.

To attain the above object, the present invention provides the image display unit as described above, wherein said gate line has a laminated structure including a bottom layer metal film and a top layer metal film, and a top electrode of said storage capacitor is a metal film on the same layer as said bottom layer metal film to make up said gate lines.

Also, the present invention provides the image display unit as described above, wherein said thin-film transistor is in two different types, i.e. n-channel conductive type and p-channel conductive type, a gate electrode of one of the thin-film transistors has a laminated structure with the same arrangement as said gate electrode, and a gate electrode of the other of the thin-film transistors is an electrode in the same layer as the bottom layer metal film of said gate electrode.

Further, the present invention provides the image display unit as described above, wherein said bottom layer metal film of said gate electrode is a transparent electrode.

Also, the present invention provides the image display unit as described above, wherein the film thickness of said bottom layer metal film is made thinner than the film thickness of said top layer metal film and film thickness of the bottom layer metal film is set in the range from 20 nm to 60 nm.

Further, the present invention provides the image display unit as described above, wherein the bottom electrode to make up the storage capacitor consists of the one with n-type polysilicon and the one with p-type polysilicon.

Also, the present invention provides the image display unit as described above, wherein the width of the bottom layer metal film to make up said gate electrode of said thin-film transistor is equal to the width of the top layer metal film.

Further, the present invention provides the image display unit as described above, wherein the width of the bottom layer metal film to make up said gate electrode of said thin-film transistor is wider than the width of the top layer metal film.

The present invention is not limited to the arrangement as described above and to the arrangement of the embodiments described in the mode of implementation of the invention, and various changes and modifications can be made without departing from the spirit and the scope of technical concept of the invention.

By designing the thin-film transistor in the structure as described in the invention, ion implantation for the bottom electrode of the storage capacitor can be performed at the same time as the ion implantation of the source-drain, and this makes it possible to reduce one process in the ion implantation processes. Also, ion implantation for threshold adjustment of PMOSTFT is performed by doping of the source-drain of PMOSTFT, i.e. by using resist pattern from ion implantation, and one process can be reduced in the ion implantation process. As a result, the image display unit can be manufactured in shorter time and at lower cost.

DETAILED DESCRIPTION OF THE PREFERRED EMBODIMENTS

Detailed description will be given below on the best aspect of the embodiment of the present invention.

Embodiment 1

Figure 1A:
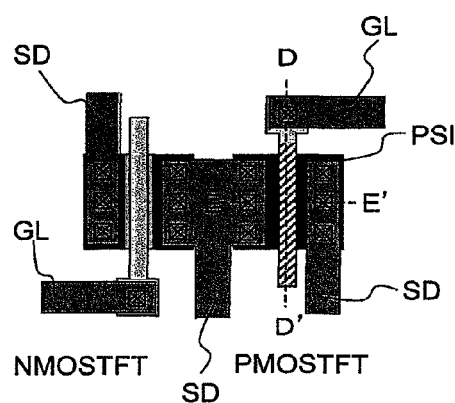
FIG. 1 represents plan views of a thin-film transistor prepared on an active matrix type substrate to explain the Embodiment 1 of an image display unit according to the present invention.
Figure 1B:
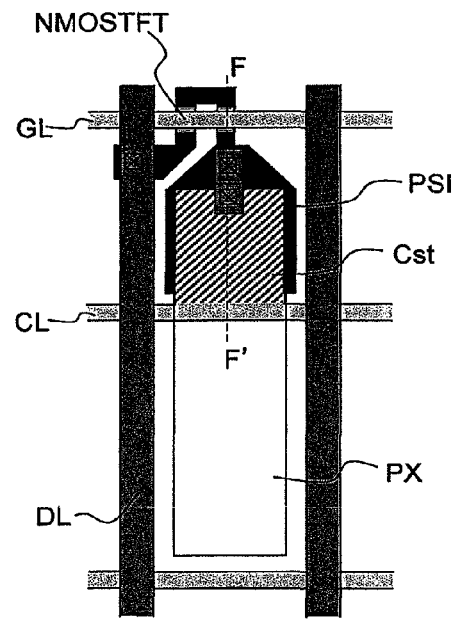
Figure 2A:
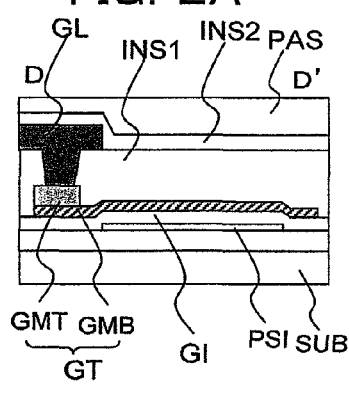
FIG. 2 represents cross-sectional views of the thin-film transistor as shown in FIG. 1.
Figure 2B:
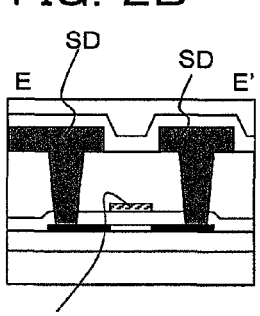
Figure 2C:
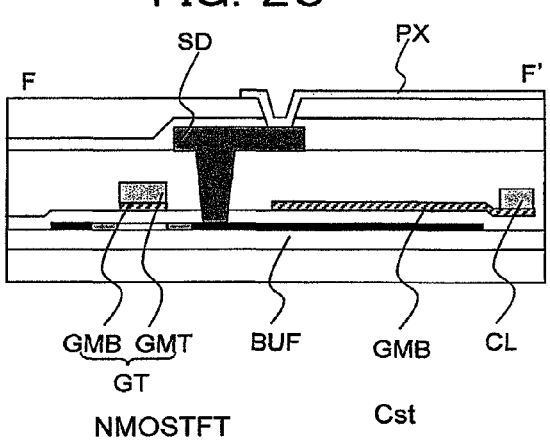
Figure 3:
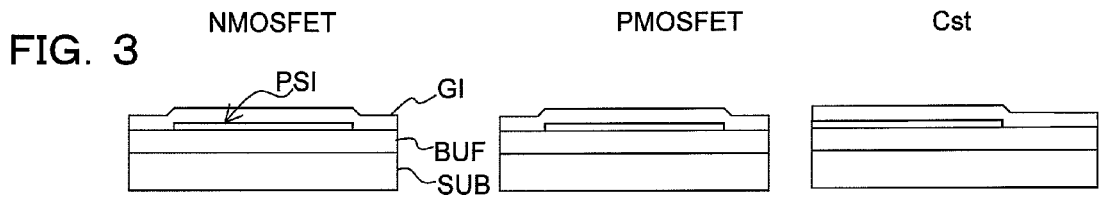
FIG. 3 is a drawing of processes to explain a method for manufacturing the active matrix type substrate of the Embodiment 1 of the image display unit of the invention.

FIG. 1 represents plan views of a thin-film transistor region prepared on an active matrix type substrate to explain the Embodiment 1 of an image display unit according to the present invention. FIG. 1 (a) is a plan view of a part of a peripheral circuit, and FIG. 1 (b) is a plan view of a part of a pixel circuit. The thin-film transistor as shown in FIG. 1 is of top gate type. FIG. 2 represents cross-sectional views of the thin-film transistor region as shown in FIG. 1. FIG. 2 (a) is a cross-sectional view of a PMOSTFT region along the line D-D' in FIG. 1 (a). FIG. 2 (b) is a cross-sectional view along the line E-E' of FIG. 1 (a), showing the PMOSTFT region. FIG. 2 (c) is a cross-sectional view along the line F-F' of FIG. 1 (b), showing the NMOSTFT region and the storage capacitor Cst.

In FIG. 1 and FIG. 2, an underlying film BUF is deposited on the surface of a substrate SUB, and a polysilicon film PSI is prepared on it by patterning. A bottom layer metal GMB and a top layer metal GMT of a gate electrode GT are laminated via a gate insulator film GI. An insulator film INS1 is deposited to cover the gate electrode. A contact hole is opened on the insulator film INS1, and a gate line GL connected to the top layer metal GMT of the gate electrode is prepared. Further, a contact hole is formed, which reaches the polysilicon film PSI from the insulator film INS1 via the gate insulator film GI, and source-drain electrodes SD are provided.

An insulator film INS2 is formed to cover the source-drain electrodes SD, and a protective insulator film PAS is arranged on the uppermost layer. In the pixel area shown in FIG. 2 (c), a pixel electrode PX is deposited on the protective insulator film PAS. The pixel electrode PX is connected to the source-drain electrodes SD via a contact hole formed on the protective insulator film PAS and the insulator film INS2.

As shown in FIG. 2 (a) and FIG. 2 (c), the gate electrode is designed in a laminated structure, comprising a bottom layer metal GMB and a top layer metal GMT. Thin metal is used as the bottom layer metal GMB. A top electrode of the storage capacitor Cst is made of the bottom layer metal GMB only. An ion implanter for bottom electrode of the storage capacitor Cst is passed along the bottom layer metal GMB, and ion implantation of the source-drain is performed at the same time. As shown in FIG. 2 (a) and FIG. 2 (b), the gate electrode of PMOSTFT is also made of the bottom layer metal GMB only, and the ion implantation of the source-drain and the ion implantation for threshold adjustment are performed by using the same resist.

By designing the thin-film transistor and the storage capacitor in the structure as described above, the number of the processes can be reduced by one process each in the photolithographic process and ion implantation process. As a result, the active matrix substrate of the image display unit can be manufactured in shorter time and at lower cost. By using this active matrix substrate, an image display unit to give higher image quality can be manufactured at lower cost.

Next, description will be given on a method for manufacturing the active matrix substrate of the Embodiment 1 of the image display unit of the present invention as explained in connection with FIG. 1 and FIG. 2 by referring to FIG. 3 to FIG. 11. In FIG. 3 to FIG. 11, a cross-sectional view of a NMOSTFT region is shown at the left in each of the drawings. A cross-sectional view of a PMOSTFT region is shown at the center in each of the drawings. A cross-sectional view of the storage capacitor Cst is shown at the right in each of the drawings. The details described above of these drawings are given only in FIG. 3.

First, on a glass substrate SUB, which is a transparent insulator substrate, a silicon oxide film $SiO_2$ is deposited with the thickness of 100 nm as an underlying film BUF. (A silicon nitride film SiN may be deposited in the same thickness under it and may be used as a laminated underlying film.) On the underlying film BUF, an amorphous silicon layer (a-Si) is deposited in thickness of 50 nm by the plasma CVD method. XeCl excimer layer is projected to the amorphous silicon layer to crystallize it, and a polysilicon film (p-Si) PSI is prepared. By a first photolithographic process and dry etching, the polysilicon film PSI is formed in island-like shape by patterning. On it, a silicon oxide film is deposited in thickness of 100 nm as the gate insulator film GI by the plasma CVD method.

Figure 4:
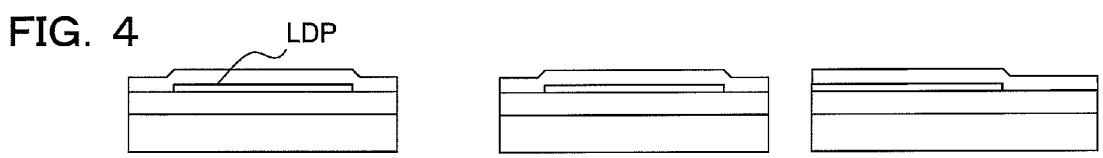
FIG. 4 is a drawing of processes similar to FIG. 3 to explain the method for manufacturing the active matrix substrate of the Embodiment 1 of the image display unit of the invention.
Figure 5:
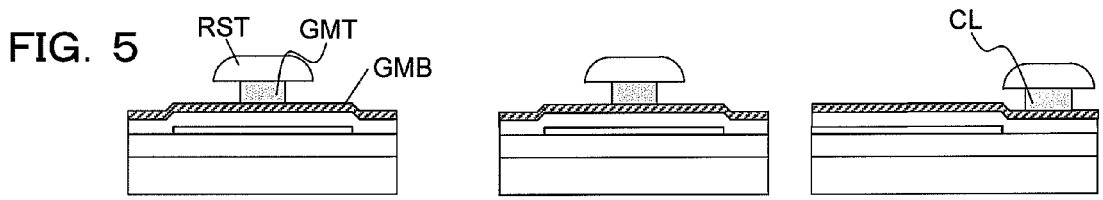
FIG. 5 is a drawing of processes similar to FIG. 4 to explain the method for manufacturing the active matrix substrate of the Embodiment 1 of the image display unit of the invention.

For threshold adjustment of NMOSTFT, boron ions are implanted by low density ion implantation on the entire surface with implantation energy of 30 keV and implantation quantity of $1 \times 10^{12}/cm^2$ (formation of LDP region) (FIG. 4).

As the bottom layer metal (lower gate layer) GMB of the gate electrode GT, titanium (Ti) is deposited in thickness of 30 nm. As the top layer metal (upper gate layer) GMT, molybdenum-tungsten (MoW) is continuously deposited in thickness of 150 nm by the sputtering method. As the material of the bottom layer metal GMB, titanium nitride (TiN) or other adequate metal may be used instead of titanium. The thickness of the bottom layer metal GMB is preferably thinner because it is used as a through-film at the time of ion implantation. However, if it is too thin, disconnection of the line or the increase of resistance may occur, and the thickness is preferably in the range of about 20-60 nm. If the bottom layer metal GMB is thin, the light partially passes through it, and brighter pixel can be obtained. By using a transparent metal such as ITO (indium tin oxide) or ZnO as the bottom layer metal, the light can pass through much easier. As the top layer metal GMT, molybdenum (Mo), tungsten (W), chromium (Cr) or other type of metal may be used instead of MoW. However, a material to give adequate selection ratio at the time of etching of the top layer metal GMT should be used as the bottom layer metal GMB. The thickness of the top layer metal GMT is preferably in the range of 120-200 nm. By the second photolithographic process and wet etching, the top layer metal GMT is processed. In this case, it is processed so that side etching of 1 μm can be made for the subsequent formation of LDD region. The width of side etching is preferably in the range of 0.5-2 μm. The storage capacitor Cst should be laid out so that the top layer metal GMT is removed. In so doing, ion implantation of the bottom electrode of the storage capacitor can be performed after the preparation of the gate electrode. Also, the storage line (storage capacitor line) CL is left as it is laminated to prevent the increase of resistance.

Figure 6:
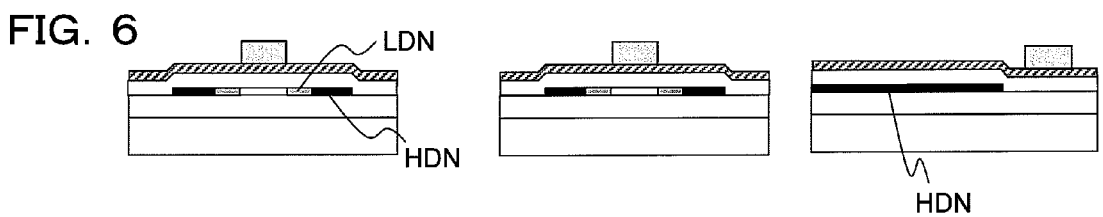
FIG. 6 is a drawing of processes similar to FIG. 5 to explain the method for manufacturing the active matrix substrate of the Embodiment 1 of the image display unit of the invention.

Leaving the resist remaining as it is, high density n-type ion implantation is performed with phosphorus ions of $8 \times 10^{14}$ $cm^{-2}$ at 75 keV (formation of HDN region). As a result, ion implantation can be performed on the source and the drain. At the same time, ions can be implanted to the bottom electrode of the storage capacitor Cst. That is, one process can be reduced in the ion implantation process. To alleviate electric field at the end of the drain, phosphorus ion implantation with low implantation quantity is carried out with $1 \times 10^{13}/cm^{-2}$ at 80 keV, and LDD region is prepared. The ion implantation for LDD region may be carried out after the processing of the next bottom layer metal GMB (FIG. 6).

Figure 7:
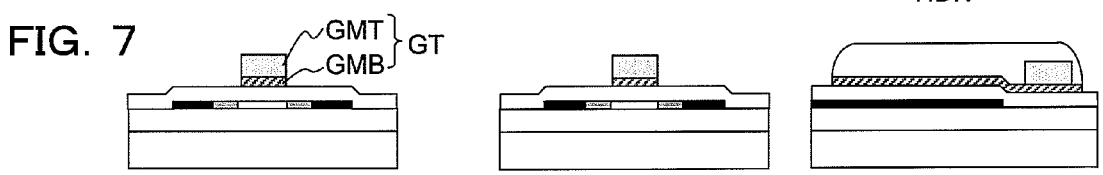
FIG. 7 is a drawing of processes similar to FIG. 6 to explain the method for manufacturing the active matrix substrate of the Embodiment 1 of the image display unit of the invention.

By the third photolithographic process and dry etching, the bottom layer metal GMB is processed. In this case, the NMOSTFT and the PMOSTFT are processed by using the top layer metal GMT of the gate electrode GT as a mask, and the storage capacitor Cst is processed by using the resist RST as a mask. The bottom layer metal GMB may be processed by wet etching (FIG. 7).

Figure 8:
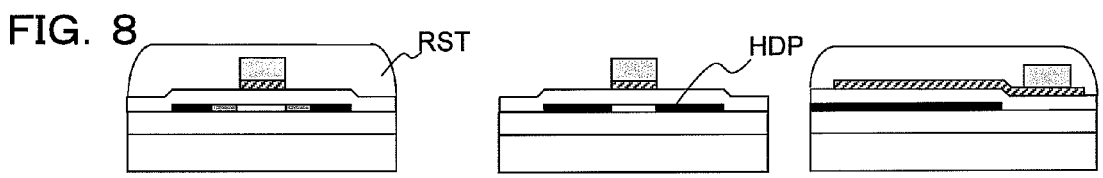
FIG. 8 is a drawing of processes similar to FIG. 7 to explain the method for manufacturing the active matrix substrate of the Embodiment 1 of the image display unit of the invention.

By the fourth photolithographic process, the NMOSTFT and the storage capacitor Cst are covered with the resist RST, and high density p-type ion implantation is performed with boron ions of $1.5 \times 10^{15}$ $cm^{-1}$ at 30 keV, and ion implantation is carried out on the source-drain of the PMOSTFT (FIG. 8).

Leaving the resist RST remaining as it is, the top layer metal GMT of the PMOSTFT is removed. The gate electrode of the PMOSTFT has the bottom layer metal GMB only. The contact region and the line region are left under laminated condition. Then, by leaving the resist RST remaining as it is, phosphorus ions of $1 \times 10^{12}$ $cm^{-2}$ are implanted at 80 keV via the bottom layer metal GMB for threshold adjustment of MOSTFT (formation of LDN region).

Figure 9:
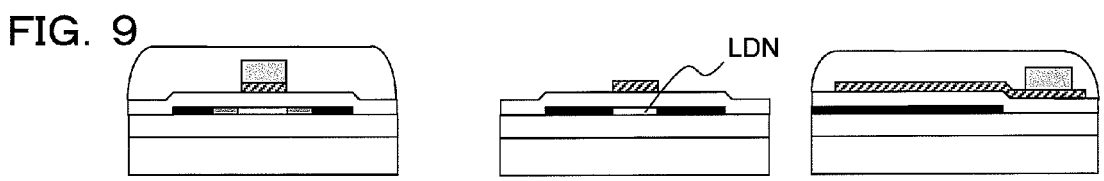
FIG. 9 is a drawing of processes similar to FIG. 8 to explain the method for manufacturing the active matrix substrate of the Embodiment 1 of the image display unit of the invention.

As a result, one process in the photolithographic process can be reduced (FIG. 9).

Figure 10:
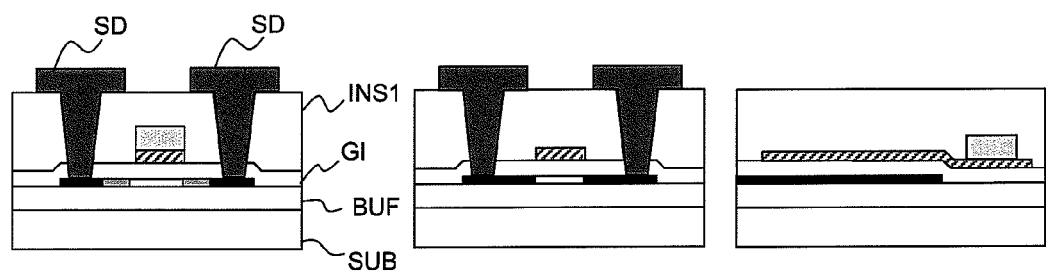
FIG. 10 is a drawing of processes similar to FIG. 9 to explain the method for manufacturing the active matrix substrate of the Embodiment 1 of the image display unit of the invention.

As the interlayer insulator film INS1, a $SiO_2$ film is deposited by the plasma CVD method. By the fifth photolithographic process and wet etching, a contact hole is formed. A laminated film of MoW/Al/MoW is deposited as a wiring layer by the sputtering method. By the sixth photolithographic process and wet etching, the source-drain SD and the wiring are prepared (FIG. 10).

Figure 11:
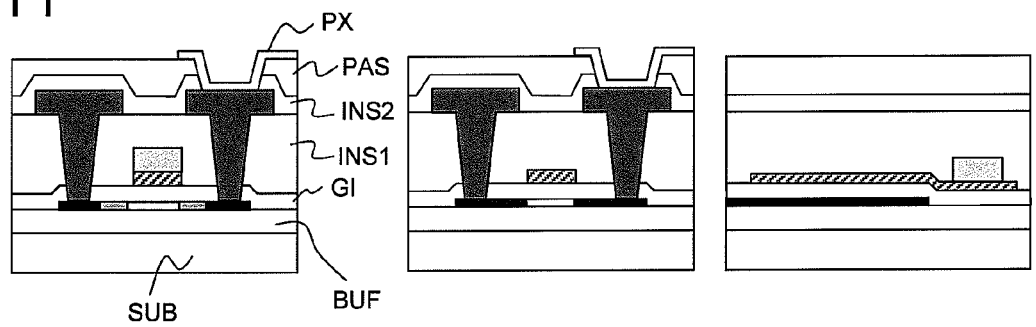
FIG. 11 is a drawing of processes similar to FIG. 10 to explain the method for manufacturing the active matrix substrate of the Embodiment 1 of the image display unit of the invention.

As the insulator layer INS2, a SiN film is deposited by the plasma CVD method. Further, a photosensitive organic film is coated as the protective insulator film PAS. By the seventh photolithographic process and etching, a contact hole is formed. As the transparent metal for the pixel electrode, ITO film is deposited by the sputtering method. By the eighth photolithographic process and wet etching, the pixel electrode PX is prepared (FIG. 11).

By the manufacturing process as described above, one process each can be reduced in the photolithographic process, which requires the longest time, and in implantation process, and the active matrix substrate can be manufactured in shorter time and at lower cost. Because the light passes through the storage capacitor, an image display unit to give brighter image can be obtained.

Embodiment 2

In the active matrix substrate in the Embodiment 1 as described above, the bottom electrode to make up the storage capacitor is made of n-type polysilicon. In the active matrix substrate in the Embodiment 2 of the image display unit of the present invention, the storage capacitor has the bottom electrode of n-type polysilicon and the bottom electrode of p-type polysilicon.

Now, referring to FIG. 12 to FIG. 16, description will be given on a method for manufacturing the active matrix substrate of the Embodiment 2 of the image display unit of the present invention. In FIG. 12 to FIG. 16, a cross-sectional view of the NMOSTFT region is shown at the left in each of the drawings. A cross-sectional view of the PMOSTFT region is shown at the left of the center in each of the drawings. A cross-sectional view of the storage capacitor Cst with N-type bottom electrode is shown at the right of the center in each of the drawings, and a cross-sectional view of the storage capacitor Cst with P-type bottom electrode is shown at the right in each of the drawings. The details described above of the drawings are shown only in FIG. 12.

Figure 12:
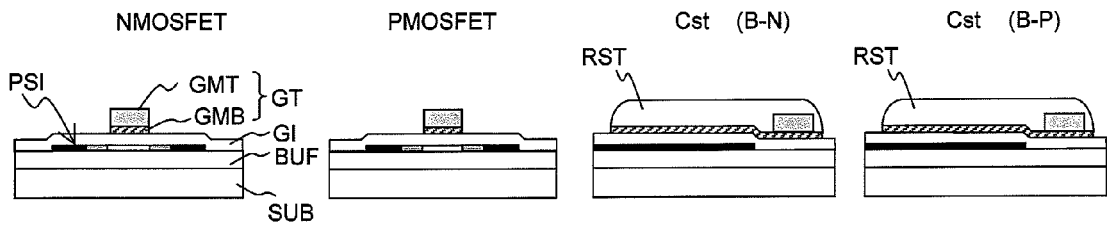
FIG. 12 is a drawing of processes to explain a method for manufacturing an active matrix substrate of the Embodiment 2 of an image display unit according to the invention.

First, by the same manufacturing process as the process in FIG. 3 to FIG. 6 of the Embodiment 1, the processes are performed up to the processing of the bottom layer metal GMB of the gate electrode. The description of the processing of the bottom layer metal GMB is the same the one given in the Embodiment 1 (FIG. 12).

Figure 13:
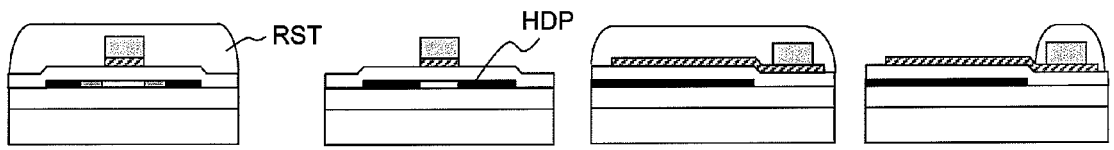
FIG. 13 is a drawing of processes similar to FIG. 12 to explain a method for manufacturing the active matrix substrate of the Embodiment 2 of the image display unit according to the present invention.

Next, when the NMOSTFT and the storage capacitor are covered by the resist in the fourth photolithographic process, an opening is formed on a region where the bottom electrode of p-type polysilicon is to be made. High density p-type ion implantation is performed by using boron ions of $1.5 \times 10^{15}$ $cm^{-2}$ at 30 keV. Ion implantation is performed on the source-drain of the PMOSTFT, and HDP region is prepared. At the same time, doping is carried out on the bottom electrode GMB of the storage capacitor Cst (ion implantation) (FIG. 13).

Figure 14:
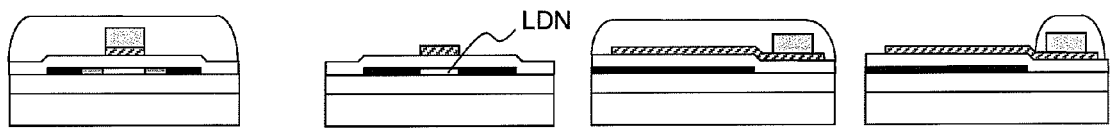
FIG. 14 is a drawing of processes similar to FIG. 13 to explain a method for manufacturing the active matrix substrate of the Embodiment 2 of the image display unit according to the present invention.

Then, in the same manner as the manufacturing process in the Embodiment 1, by leaving the resist RST remaining as it is, the top layer metal GMT of the PMOSTFT is removed. The gate electrode of the PMOSTFT has now only the bottom layer metal GMB. The contact region and the line region are left under laminated condition. By leaving the resist RST remaining as it is, phosphorus ions are implanted with $1 \times 10^{12}$ $cm^{-2}$ at 80 keV via the bottom layer metal GMB for threshold adjustment of the PMOSTFT. As a result, one process can be reduced in the photolithographic process (FIG. 14).

Figure 15:
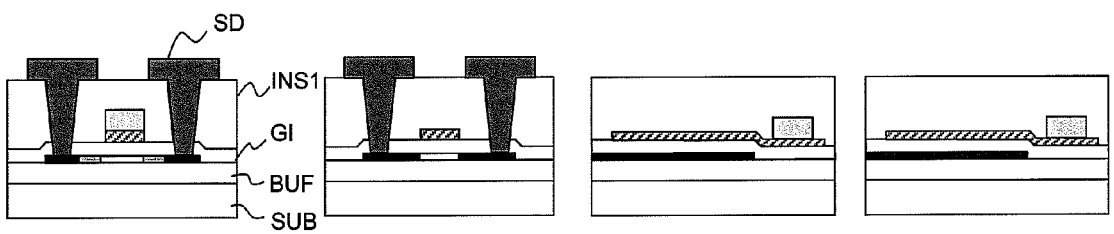
FIG. 15 is a drawing of processes similar to FIG. 14 to explain a method for manufacturing the active matrix substrate of the Embodiment 2 of the image display unit according to the present invention.

As the interlayer insulator film INS1, a $SiO_2$ film is prepared by the plasma CVD method. By the fifth photolithographic process and wet etching, a contact hole is formed. As a wiring layer, a laminated film of MoW/Al/MoW is deposited by the sputtering method. By the sixth photolithographic process and wet etching, the source-drain SD and the wiring are prepared (FIG. 15).

Figure 16:
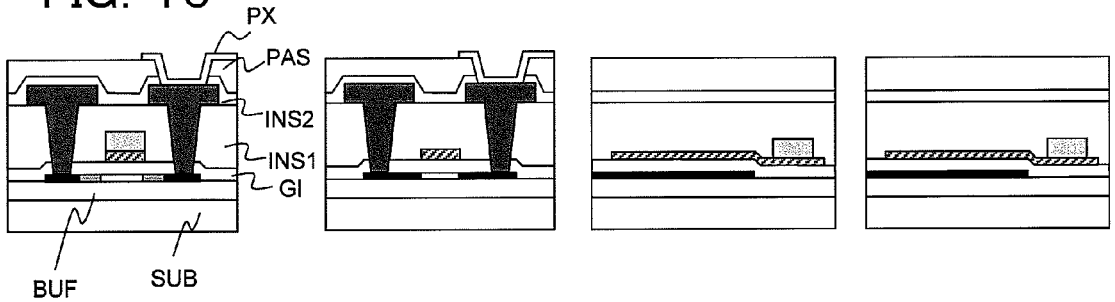
FIG. 16 is a drawing of processes similar to FIG. 15 to explain a method for manufacturing the active matrix substrate of the Embodiment 2 of the image display unit according to the present invention.

As the insulator layer INS2, a SiN film is deposited by the plasma CVD method. Further, a photosensitive organic film is coated as a protective insulator film PAS. By the seventh photolithographic process and etching, a contact hole is formed. As a transparent metal for pixel electrode, ITO film is deposited by the sputtering method. By the eighth photolithographic process and wet etching, the pixel electrode PX is prepared (FIG. 16).

In the manufacturing process as described above, one process each can be reduced in the photolithographic process requiring the longest time and in the implantation process, and the active matrix substrate can be produced in shorter time and at lower cost. Because the light passes through the storage capacitor, an image display unit to provide brighter image can be obtained.

Embodiment 3

In the active matrix substrate in the Embodiment 1, the NMOSTFT has LDD structure. In the Embodiment 3, the NMOSTFT of LDD structure and GOLD (Gate Overlapped LDD) structure are adopted. Referring to FIG. 17 to FIG. 21, description will be given on the process for manufacturing the active matrix substrate of the Embodiment 3. In FIG. 17 to FIG. 21, the NMOSTFT of peripheral circuit region (circuit region) such as driving circuit is shown at the left in each of the drawings. The PMOSTFT is shown at the left of the center in each of the drawings, the NMOSTFT of the pixel area is shown at the right of the center in each of the drawings, and a cross-sectional view of the storage capacitor Cst is shown at the right in each of the drawings.

The GOLD structure has higher hot carrier tolerance (endurance) than the LDD structure, while it is higher in leakage current and adding capacity than the LDD structure. In this respect, the LDD structure is adopted for the NMOSTFT of the pixel area where lower leakage current and lower adding capacity are required, and the GOLD structure is adopted for the NMOSTFT of peripheral circuit region where hot carrier is most likely to occur.

First, by the same manufacturing process used in FIG. 3 to FIG. 6 in the Embodiment 1, the processing is performed to the bottom layer metal GMB of the gate electrode. The description on the processing of the bottom layer metal GMB is the same as the description given in the Embodiments as described above, and details are not given here.

Figure 17:
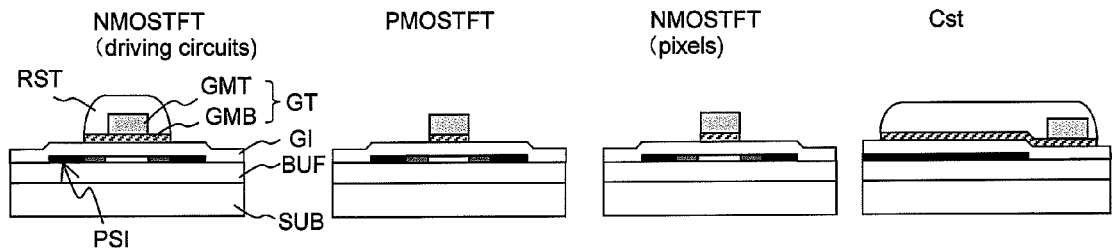
FIG. 17 is a drawing of processes similar to FIG. 16 to explain a method for manufacturing the active matrix substrate of the Embodiment 3 of the image display unit according to the present invention.

Next, in the photolithographic process for the processing of the lower gate for the NMOSTFT of the circuit region, resist patterning is prepared with a width by 1 μm wider than the upper gate (FIG. 17).

Figure 18:
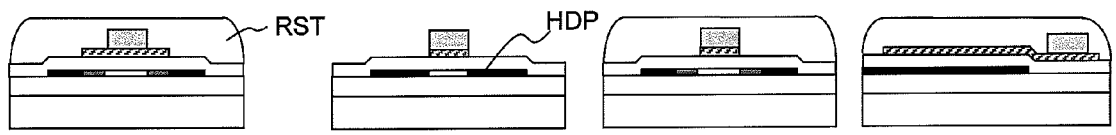
FIG. 18 is a drawing of processes similar to FIG. 17 to explain a method for manufacturing the active matrix substrate of the Embodiment 3 of the image display unit according to the present invention.

In the processes similar to those of the Embodiment 1, by the fourth photolithographic process, the NMOSTFT and the storage capacitor Cst are covered by the resist RST. High density p-type ion implantation is performed with boron ions of $1.5 \times 10^{15}$ $cm^{-2}$ at 30 keV, and ions are implanted in the source-drain of the PMOSTFT (formation of HDP region) (FIG. 18).

Figure 19:
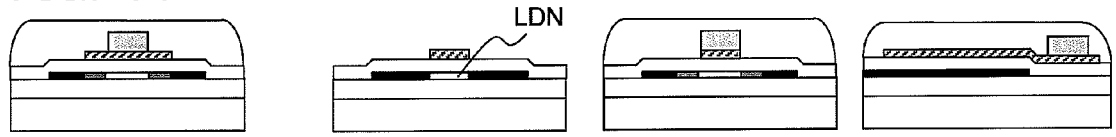
FIG. 19 is a drawing of processes similar to FIG. 18 to explain a method for manufacturing the active matrix substrate of the Embodiment 3 of the image display unit according to the present invention.

By leaving the resist remaining as it is, the top layer metal GMT of the PMOSTFT is removed. The gate electrode of the PMOSTFT has only the bottom layer metal GMB. The contact region and the wiring region are left under laminated condition. Next, by leaving the resist RST remaining as it is, phosphorus ions of $1 \times 10^{12} \, cm^{-2}$ are implanted via the bottom layer metal GMB at 80 keV for threshold adjustment of the PMOSTFT. As a result, one process can be reduced in the photolithographic process (FIG. 19).

Figure 20:
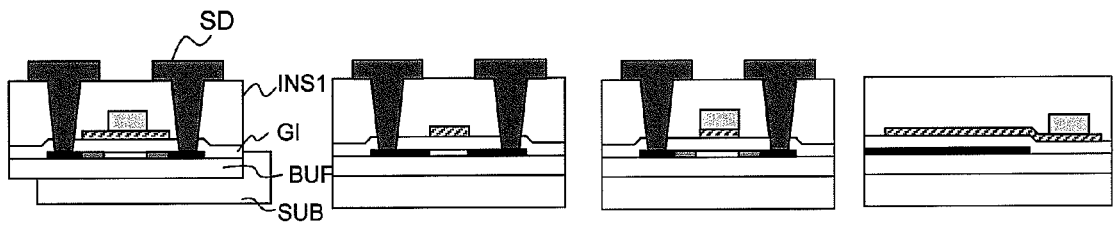
FIG. 20 is a drawing of processes similar to FIG. 19 to explain a method for manufacturing the active matrix substrate of the Embodiment 3 of the image display unit according to the present invention.

As the interlayer insulator film INS1, a $SiO_2$ film is deposited by the plasma CVD method. By the fifth photolithographic process and wet etching, a contact hole is formed. As the wiring layer, a laminated film of MoW/Al/MoW is deposited by the sputtering method. By the sixth photolithographic process and wet etching, the source-drain SD and the wiring are prepared (FIG. 20).

Figure 21:
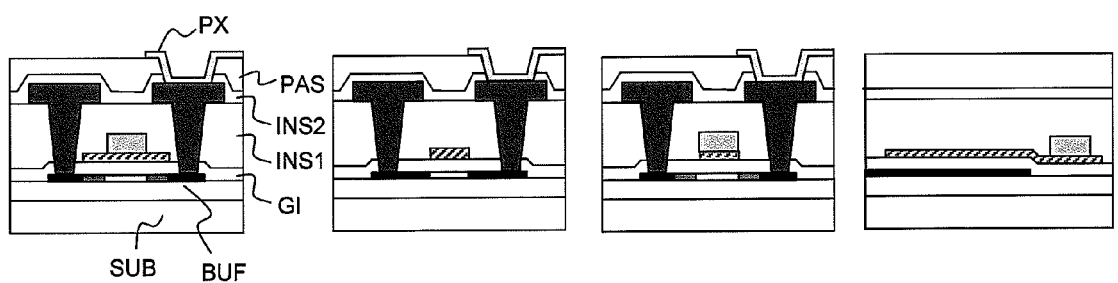
FIG. 21 is a drawing of processes similar to FIG. 20 to explain a method for manufacturing the active matrix substrate of the Embodiment 3 of the image display unit according to the present invention.

As the insulator film INS2, a SiN film is deposited by the plasma CVD method. Further, as the protective insulator film PAS, a photosensitive organic film is coated. By the seventh photolithographic process and etching, a contact hole is formed. As the transparent metal for pixel electrode, ITO film is deposited by the sputtering method. By the eighth photolithographic process and wet etching, the pixel electrode PX is prepared (FIG. 21).

In the Embodiment 3, the NMOSTFT of the LDD structure and the NMOSTFT of the GOLD structure can be obtained at the same time without increasing the number of processes.

Hot carrier tolerance (endurance) of the NMOSTFT of the peripheral circuit region can be improved. Without decreasing image display performance, an image display unit with longer service life can be manufactured.

Embodiment 4

Figure 22:
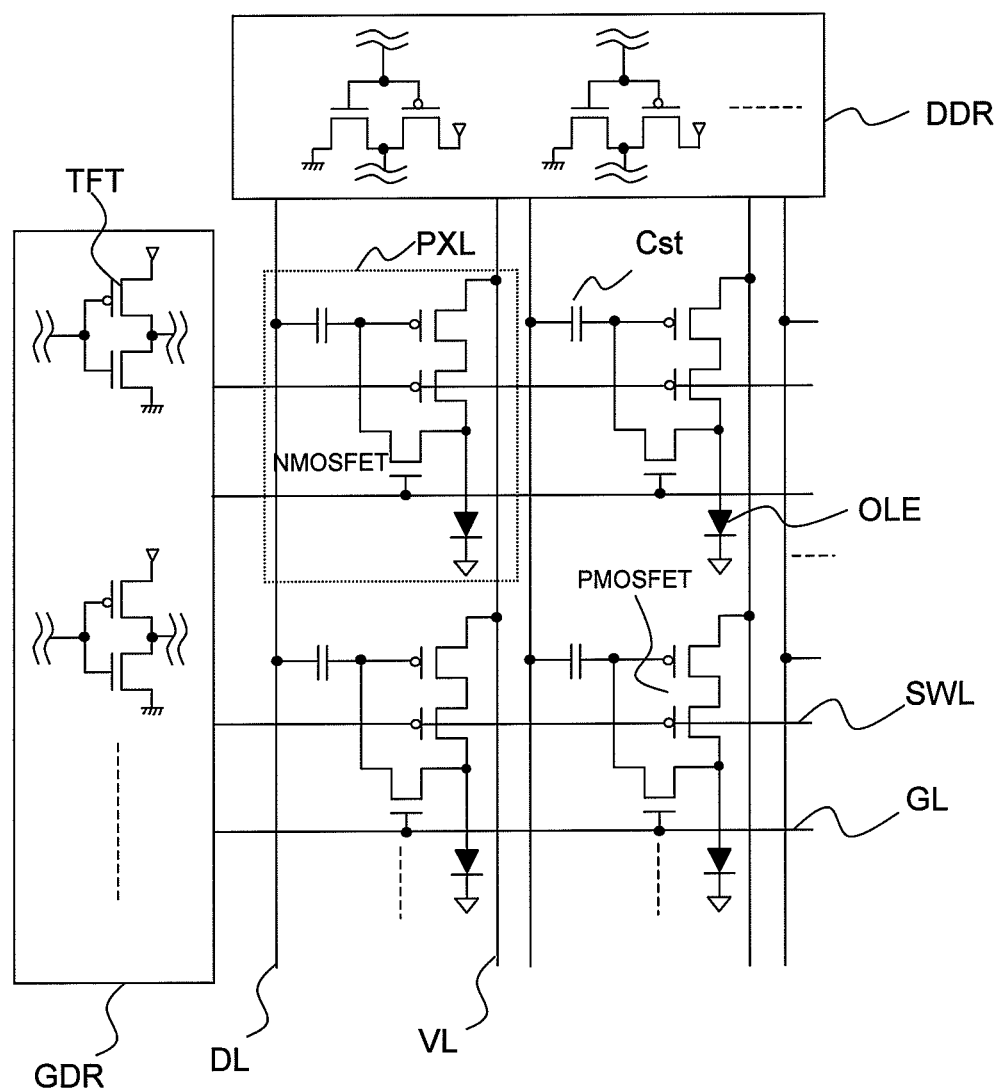
FIG. 22 is a circuit diagram of an organic EL display unit to explain the Embodiment 4 of the image display unit according to the present invention.
Figure 23A:
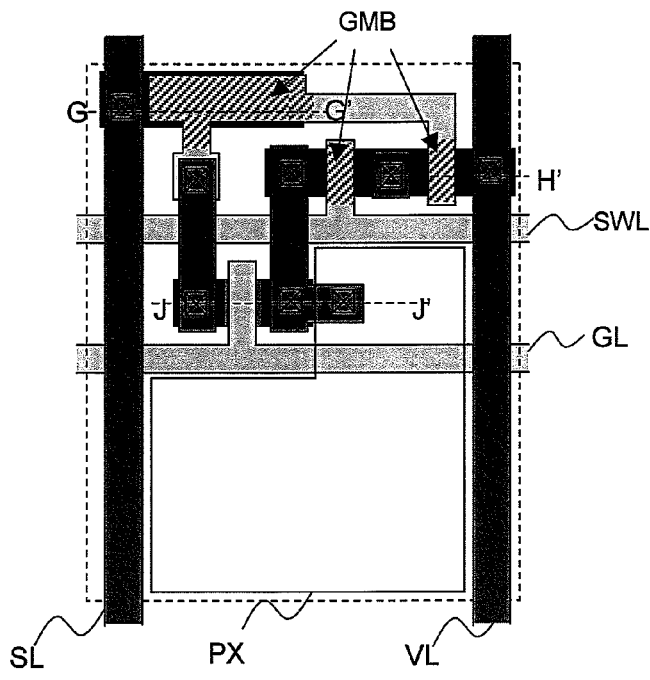
FIG. 23 represents plan views of a pixel area of the organic EL display unit of the invention.
Figure 23B:
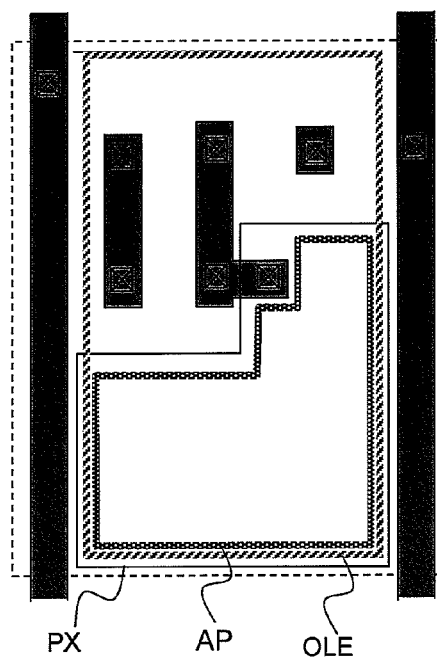
Figure 24A:
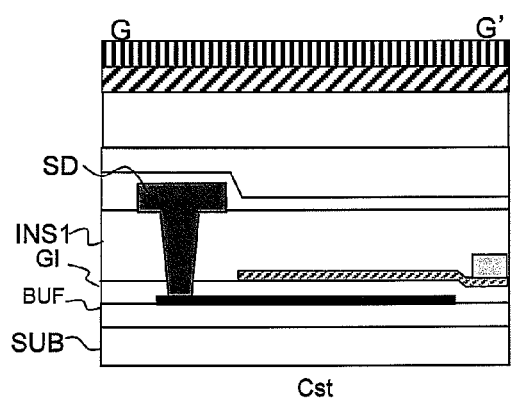
FIG. 24 represents cross-sectional views each showing an essential portion in the pixel area shown by the dotted line in FIG. 23 (a)
Figure 24B:
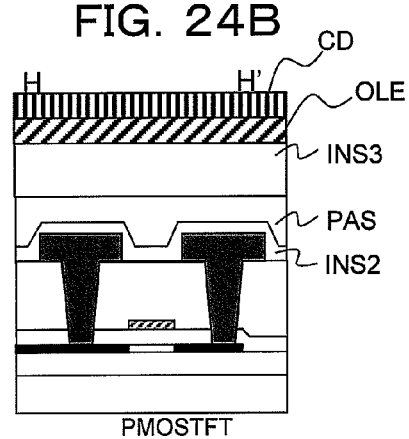
Figure 24C:
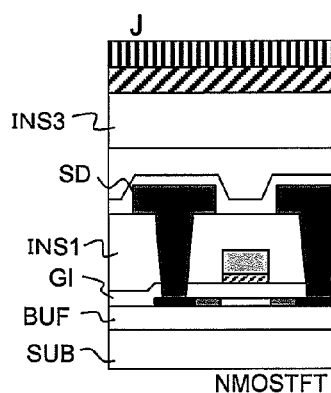
Figure 29:
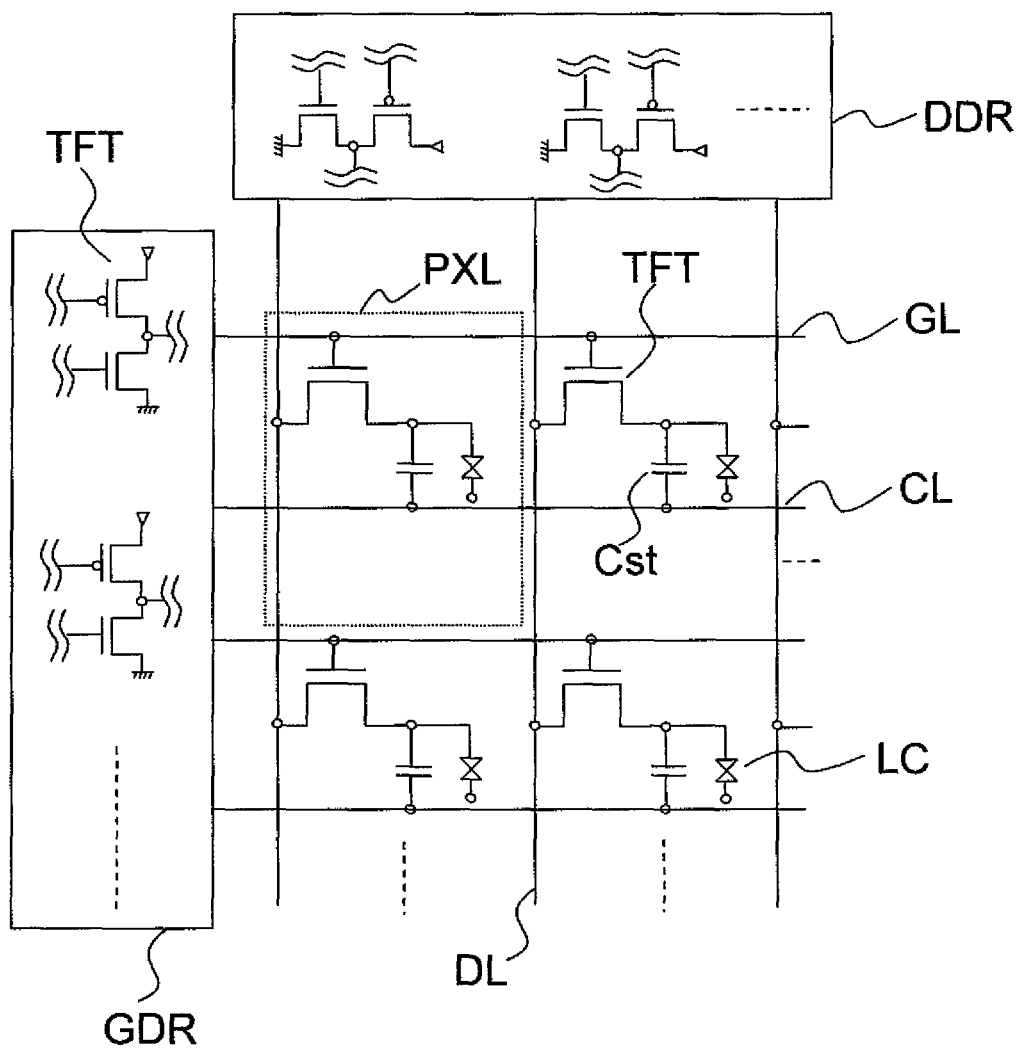
FIG. 29 is a circuit diagram of a liquid crystal display unit in an example of an image display unit according to the prior art.
Figure 30A:
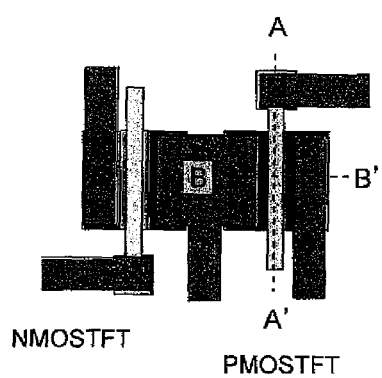
FIG. 30 represents a plan view (a) of a thin-film transistor and a plan view (b) of a pixel area PXL, which make up peripheral circuits (a data line driving circuit DDR and a gate line driving circuit GDR) in FIG. 29.
Figure 30B:
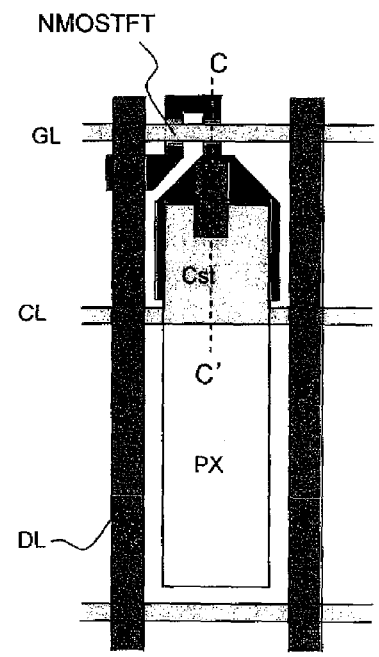
Figure 31:
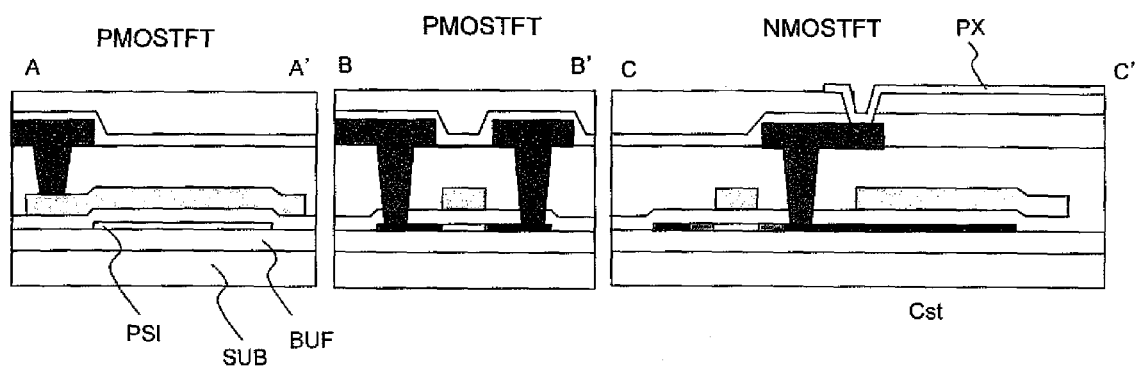
FIG. 31 represents cross-sectional views along the lines A-A', B-B' and C-C' of FIG. 30 respectively.
Figure 32:
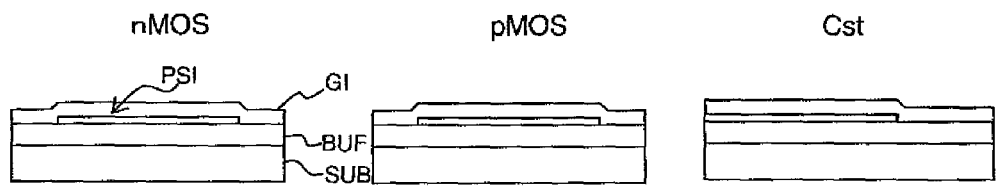
FIG. 32 represents drawings to show the manufacturing process of a PMOSTFT region, a NMOSTFT region and a storage capacitor Cst shown in FIG. 31.
Figure 33:
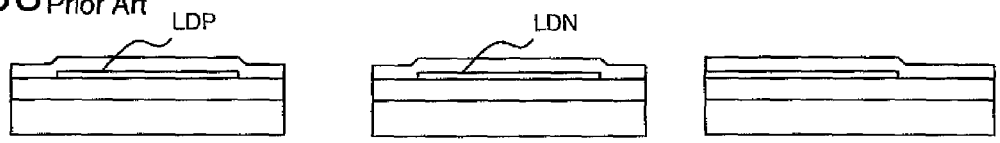
FIG. 33 represents drawings to show the manufacturing process similar to FIG. 32 of the PMOSTFT region, the NMOSTFT region and the storage capacitor Cst shown in FIG. 31.
Figure 34:
FIG. 34 represents drawings to show the manufacturing process similar to FIG. 33 of the PMOSTFT region, the NMOSTFT region and the storage capacitor Cst shown in FIG. 31.
Figure 35:
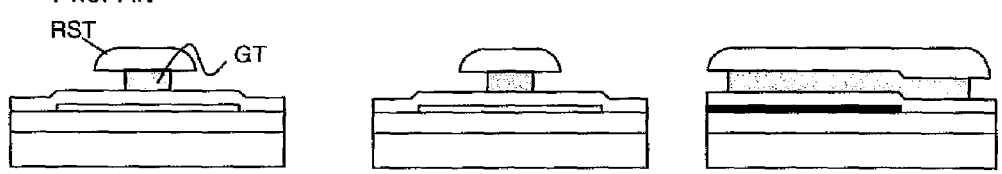
FIG. 35 represents drawings to show the manufacturing process similar to FIG. 34 of the PMOSTFT region, the NMOSTFT region and the storage capacitor Cst shown in FIG. 31.
Figure 36:
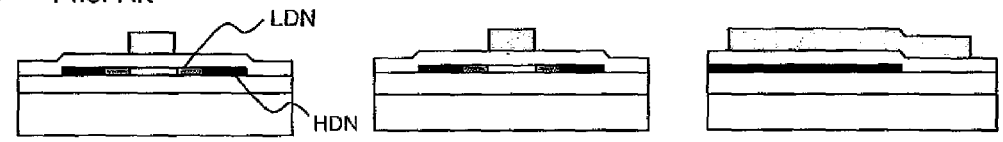
FIG. 36 represents drawings to show the manufacturing process similar to FIG. 35 of the PMOSTFT region, the NMOSTFT region and the storage capacitor Cst shown in FIG. 31.
Figure 37:
FIG. 37 represents drawings to show the manufacturing process similar to FIG. 36 of the PMOSTFT region, the NMOSTFT region and the storage capacitor Cst shown in FIG. 31.
Figure 38:
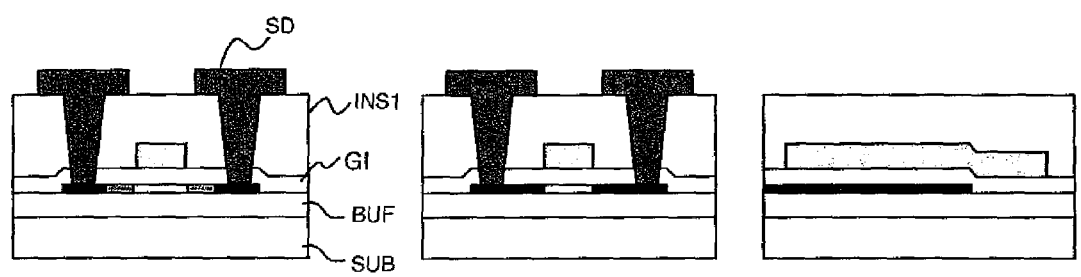
FIG. 38 represents drawings to show the manufacturing process similar to FIG. 37 of the PMOSTFT region, the NMOSTFT region and the storage capacitor Cst shown in FIG. 31.
Figure 39:
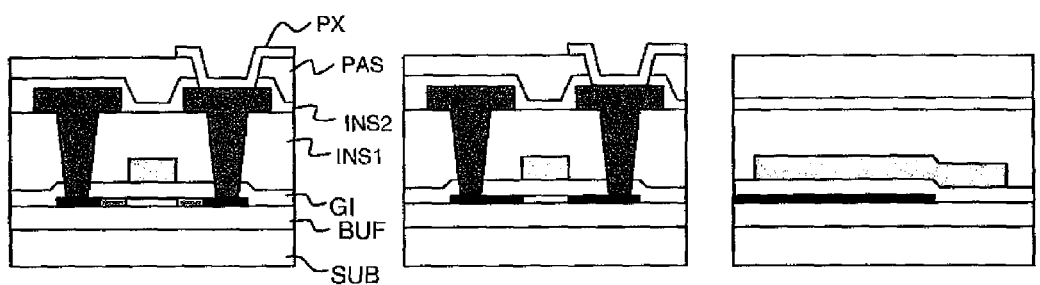
FIG. 39 represents drawings to show the manufacturing process similar to FIG. 38 of the PMOSTFT region, the NMOSTFT region and the storage capacitor Cst shown in FIG. 31.

In FIG. 29, description has been given by taking an example on a liquid crystal display unit as the image display unit, while the present invention is not limited to this, and the invention can be applied to the image display unit of the other types using the active matrix substrate. FIG. 22 is a circuit diagram of an organic EL display unit to explain the Embodiment 4 of the present invention. FIG. 23 represents top views of pixel area of the organic EL display unit. FIG. 23 (a) shows the arrangement of the wiring and the electrode, and FIG. 23 (b) is a drawing to explain the organic EL layer and an opening region. FIG. 24 represents cross-sectional views each showing an essential portion of the pixel area as shown by the dotted line in FIG. 23 (a). FIG. 24 (a) is a cross-sectional view along the line G-G' in FIG. 23 (a), and FIG. 24 (b) is a cross-sectional view along the line H-H' in FIG. 23 (a). FIG. 24 (c) is a cross-sectional view along the line J-J' in FIG. 23 (a).

The pixel PXL comprises the NMOSTFT, the PMOSTFT, the storage capacitor Cst, an organic EL element OLE, and a pixel electrode PX. It also comprises a signal line SL, a gate line GL, an on-off switch line SWL, and a voltage (power source) line VL. The pixel PXL is selected by a scanning signal sent via a gate line GL from a gate line driving circuit GDR, and display data sent from a data line driving circuit DDR via a data line DL is maintained at the storage capacitor Cst. The PMOSTFT is turned on by an on-off control signal sent via the on-off switch line SWL, and electric current to match the size of the display data maintained at the storage capacitor Cst is delivered from the power source line VL to the organic EL element OLE. The organic EL element OLE emits a light to match the value of the flowing electric current.

The storage capacitor Cst uses high density n-type polysilicon layer and the gate electrode layer as the bottom electrode and the top electrode. The thin-film transistor TFT of the gate line driving circuit of the peripheral circuit includes NMOSTFT and PMOSTFT. The procedure of the processing of the active matrix substrate of the organic EL display unit is the same as the procedure in the Embodiment 1 as explained in connection with FIG. 3 to FIG. 11. That is, the procedure of the processing of the pixel electrode PX by transparent conductive film (ITO) is the same as in the Embodiment 1.

In case of the active matrix substrate of the organic EL display unit, after the processes as described above, a SiN film INS3 is deposited by the plasma CVD method as a protective insulator film. Then, the protective insulator film above the pixel electrode is removed by photolithographic process, and an opening is formed (AP). By mask deposition method, an organic EL layer OLE is deposited. Further, a common electrode CD made of aluminum, for instance, is prepared. Therefore, this organic EL display unit is of bottom emission type to emit the light on the active matrix substrate. In case of top emission type, by which the light is emitted on opposite side of the active matrix substrate, a reflective metal film such as aluminum is used as the pixel electrode, and a transparent electrode such as ITO is used as the common electrode.

By the Embodiment 4, one process each can be reduced in the photolithographic process requiring the longest time and in the implantation process, and an active matrix substrate for the organic EL display unit can be manufactured in shorter time and at lower cost.

The insulating substrate in the Embodiment 1 to the Embodiment 4 as described above may be made of quartz or plastics instead of glass. When a laminated film of $SiO_2$ film and SiN film is used instead of the $SiO_2$ film as the underlying film layer, adverse effect of unnecessary ions on the liquid crystal layer or the like can be prevented by the SiN film, which has the effects to suppress the diffusion of impurities.

Also, the method for crystallizing the amorphous silicon is not limited to the excimer laser annealing. Solid-state laser annealing or solid-state growth by heat annealing or a combination of these may be used. The semiconductor film may be microcrystal silicon. Or, compounds of Si and Ge or other types of semiconductor of oxide already known may be used.

Figure 25:
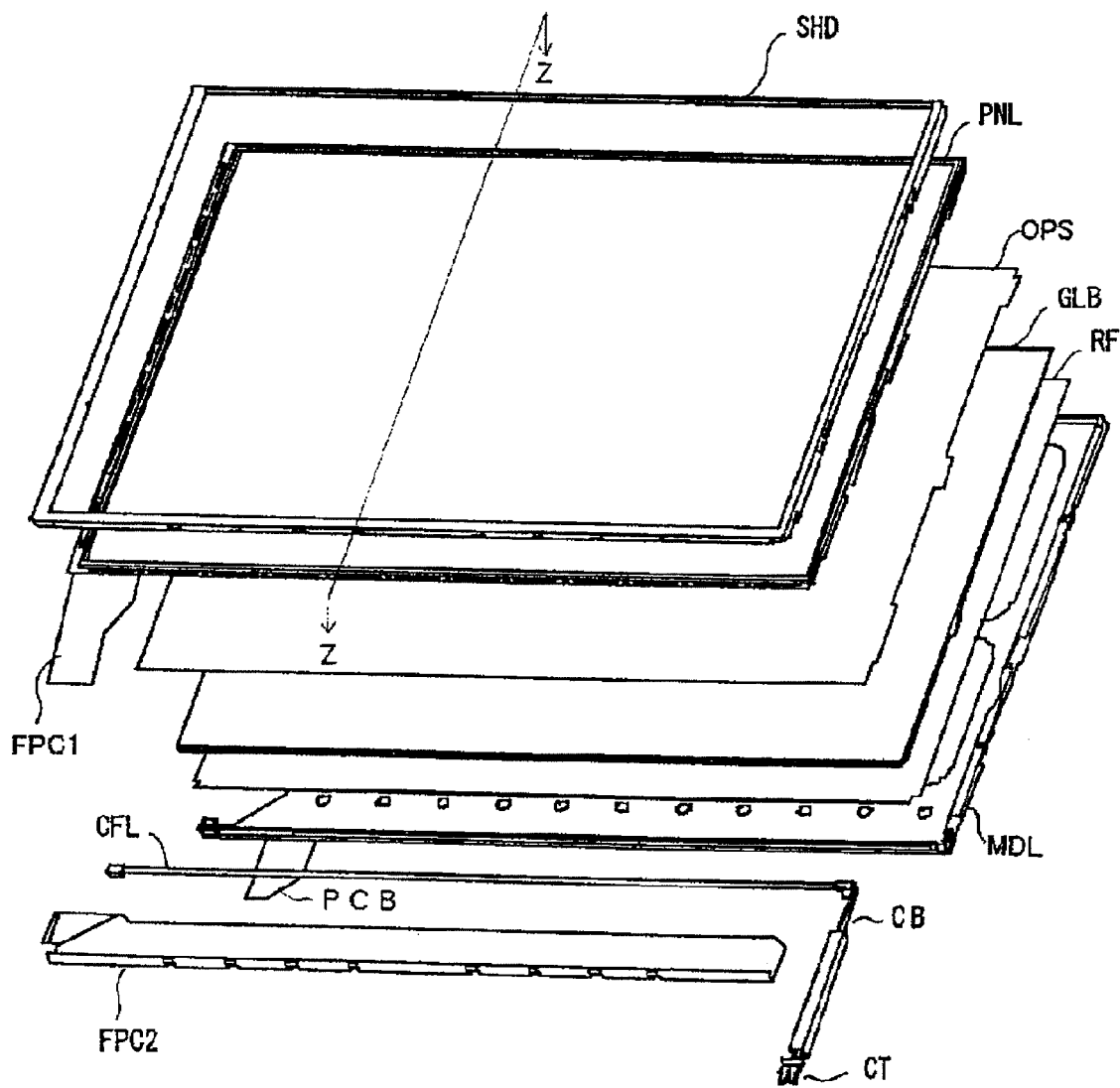
FIG. 25 is a developed perspective view to explain an example of arrangement of a liquid crystal display unit as a first example of the image display unit of the invention.
Figure 26:
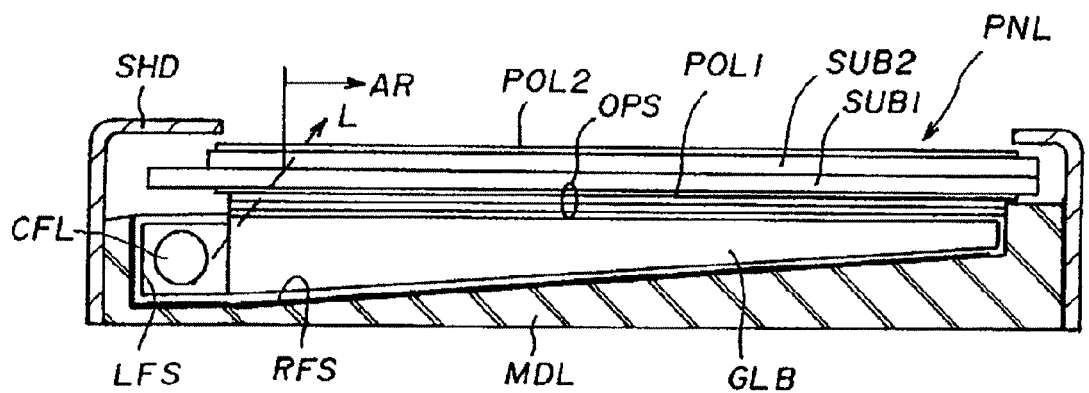
FIG. 26 is a cross-sectional view along the line Z-Z in FIG. 25.

FIG. 25 is a developed perspective view to explain an example of arrangement of a liquid crystal display unit as a first example of the image display unit of the present invention. FIG. 26 is a cross-sectional view along the line Z-Z in FIG. 25. In this liquid crystal display unit, the active matrix substrate as described above is used. In FIG. 25 and FIG. 26, the reference symbol PNL represents a liquid crystal display panel where a liquid crystal is sealed in a gap between the active matrix substrate SUB1 and a counter substrate SUB2. On front and rear surfaces of it, polarizers POLL and POL2 are laminated. Reference symbol OPS denotes an optical compensation member made of diffusion sheet or prism sheet. Reference symbol GLB represents a light guide plate, CFL is a cold cathode fluorescent lamp, RFS is a reflection sheet, LFS is a lamp reflection sheet, SHD is a shield frame, and MDL is a mold case.

On the active matrix substrate SUB1 with an arrangement of one of the Embodiment 1 to 3 as described above, a liquid crystal orientation film layer is prepared, and a force to control orientation is applied on it by the means such as rubbing. After a sealing agent is put on the periphery of a pixel area AR, a counter substrate SUB2 with an orientation film layer formed on it is placed at opposed position with a certain gap. A liquid crystal is sealed into this gap, and sealing site of the sealing agent is closed with a sealing material. On front and rear surfaces of a liquid crystal cell PNL thus prepared, polarizers POLL and POL2 are laminated. A liquid crystal display unit is manufactured by mounting a backlight or the like on it, which comprises a light guide plate GLB and a cold cathode fluorescent lamp CFL. To the driving circuit around the liquid crystal cell, data and timing signals are sent via flexible printed boards FPC1 and FPC2. On the component referred by the reference symbol PCB, a timing controller or the like is mounted, which converts a display signal inputted from the external signal source to a signal mode to display on the liquid crystal display unit between the external signal source and each of the flexible printed boards FPC1 and FPC2.

Figure 27:
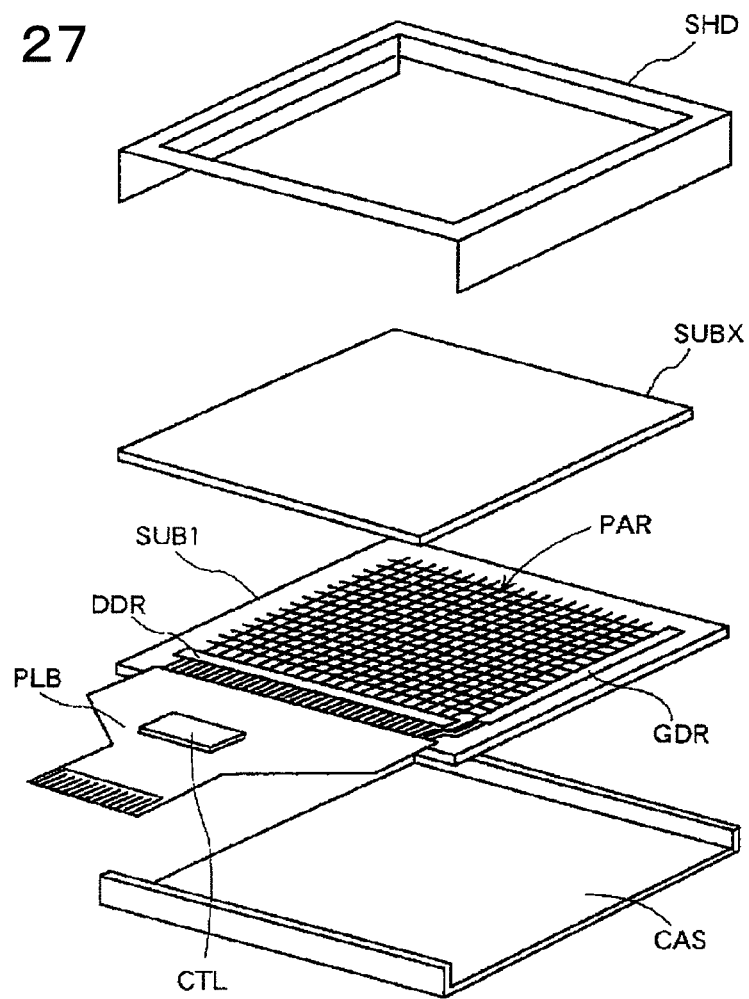
FIG. 27 is a developed perspective view to explain an example of arrangement of an organic EL display unit as a second example of the image display unit of the invention.
Figure 28:
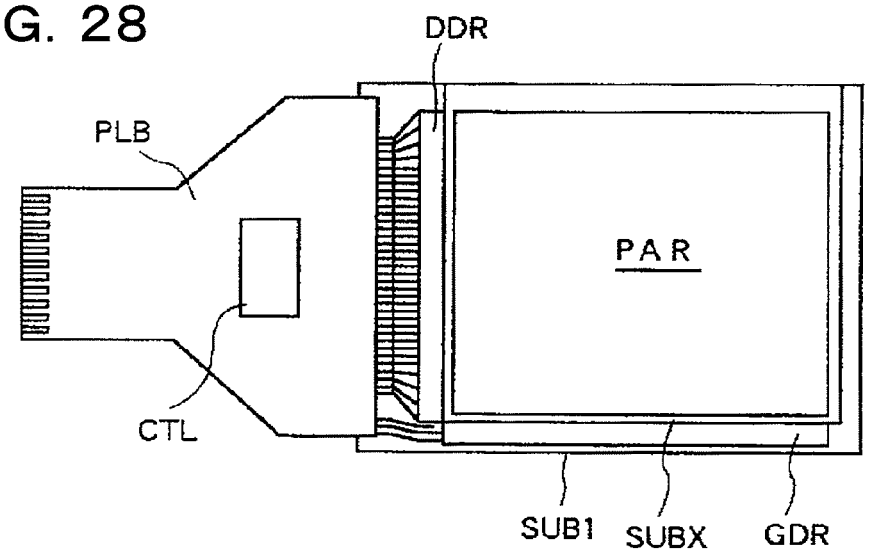
FIG. 28 is a plan view of the organic EL display unit integrated with component elements shown in FIG. 27.

FIG. 27 is a developed perspective view to explain an example of arrangement of the organic EL display unit as a second example of the image display unit of the present invention. FIG. 28 is a plan view of the organic EL display unit integrated with component elements as shown in FIG. 27. An active matrix substrate with an organic EL element deposited on the uppermost layer of one of the Embodiment 1 to 3 or the active matrix substrate of the Embodiment 4 is used. The organic EL element generally comprises a laminated member where a hole transport layer, a light emitting layer, an electronic transport layer, a cathode metal layer, etc. are deposited. A sealing material is put around the pixel area PAR of the active matrix substrate SUB1 where the laminated layer is formed and is sealed by a sealing substrate SUBX or a sealing can. A protective film may be used instead of these means.

This organic EL display unit supplies a display signal from an external signal source to the driving circuit regions DDR and GDR via the printed board PLB. An interface circuit chip CTL is mounted on the printed board PLB. This is integrated with the shield frame SHD, i.e. an upper case, and with a lower case CAS to make up the organic EL display unit.

The invention claimed is:

1. An image display unit comprising thin-film transistors of top gate type, a storage capacitor and a storage capacitor line, wherein:
   the conductivity type of one of said thin-film transistors is an n-channel conductivity type and the conductivity type of another of said thin-film transistors is a p-channel conductivity type;
   a polysilicon film, a gate insulator film, a bottom layer metal film and a top layer metal film are laminated from bottom to top;
   channels, drains and sources of said thin-film transistors are formed in the polysilicon film;
   a gate electrode of said n-channel thin-film transistor comprises a laminated structure including said bottom layer metal film and said top layer metal film,
   a gate electrode of said p-channel thin-film transistor comprises a single layer structure comprised of said bottom layer metal film;
   a top electrode of said storage capacitor is comprised of said bottom layer metal film;
   a bottom electrode of said storage capacitor is comprised of said polysilicon film;
   said storage capacitor line is comprised of said top layer metal film and is connected with the bottom layer metal film,
   phosphorous ion density of said bottom layer metal film of said bottom electrode is higher than phosphorous ion density of said bottom layer metal film of said storage capacitor line, and
   said top layer metal film does not extend over the storage capacitor.

2. An image display unit according to claim 1, wherein said bottom layer metal film comprises a transparent electrode.

3. An image display unit according to claim 1, wherein a film thickness of said bottom layer metal film is thinner than a film thickness of said top layer metal film.

4. An image display unit according to claim 3, wherein the film thickness of said bottom layer metal film is in the range from 20 nm to 60 nm.

5. An image display unit according to claim 1, wherein a width of the bottom layer metal film of said gate electrode of said n-channel thin film transistor is equal to a width of the top layer metal film of said gate electrode.

6. An image display unit according to claim 1, wherein a width of the bottom layer metal film of said gate electrode of said n-channel thin film transistor is wider than a width of the top layer metal film of said gate electrode.

7. An image display unit according to claim 1, wherein ion densities of said bottom electrode, said drains and sources are the same.

8. An image display unit according to claim 1, wherein ions are implanted to said bottom electrode, said drains and sources in a common ion implantation process.

* * * * *